(12) United States Patent
Kim

(10) Patent No.: US 6,609,741 B2
(45) Date of Patent: Aug. 26, 2003

(54) PARTS SUCTION HEAD HAVING NON-CONTACT SEALING STRUCTURE

(75) Inventor: Dong June Kim, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 10/022,623

(22) Filed: Dec. 20, 2001

(65) Prior Publication Data

US 2002/0185876 A1 Dec. 12, 2002

(30) Foreign Application Priority Data

Jun. 12, 2001 (KR) .......................... 2001-32968

(51) Int. Cl.[7] .............................. B25J 15/06; B66C 1/02
(52) U.S. Cl. ........................... 294/64.1; 294/65; 29/743
(58) Field of Search ................................ 294/64.1, 64.2, 294/64.3, 65; 901/40; 414/627, 737, 752.1; 29/740, 741, 743

(56) References Cited

U.S. PATENT DOCUMENTS

| | | | | |
|---|---|---|---|---|
| 4,728,135 A | * | 3/1988 | Sugimura et al. | 294/64.1 |
| 4,762,354 A | * | 8/1988 | Gfeller et al. | 294/64.1 |
| 4,852,247 A | * | 8/1989 | Hawkswell | 294/64.1 |
| 5,251,946 A | * | 10/1993 | Rossmeisl et al. | 294/64.1 |
| 5,758,410 A | * | 6/1998 | Asai et al. | 29/743 |
| 6,076,394 A | * | 6/2000 | Tsuda et al. | 294/64.1 |
| 6,213,528 B1 | * | 4/2001 | Hufken et al. | 294/64.1 |
| 6,260,898 B1 | | 7/2001 | Kano et al. | 294/64.1 |
| 6,287,151 B1 | | 9/2001 | Matsuzaki et al. | 439/630 |
| 6,308,403 B1 | * | 10/2001 | Hwang | 294/64.1 |
| 6,343,415 B1 | * | 2/2002 | Okuda et al. | 294/64.1 |
| 6,378,198 B1 | * | 4/2002 | Asai et al. | 29/825 |

FOREIGN PATENT DOCUMENTS

| | | | | |
|---|---|---|---|---|
| DE | 1176816 | * | 8/1968 | 294/64.1 |
| JP | 46-24328 | * | 7/1971 | 294/64.1 |
| JP | 404022198 | * | 1/1992 | 29/743 |
| JP | 405169385 | * | 7/1993 | 294/64.1 |
| JP | 405185391 | * | 7/1993 | 294/64.1 |

* cited by examiner

*Primary Examiner*—Eileen D. Lillis
*Assistant Examiner*—Paul T. Chin
(74) *Attorney, Agent, or Firm*—Fleshner & Kim, LLP

(57) ABSTRACT

A parts suction head having a non-contact sealing head is disclosed. The head includes: a moving block having first air passages on its upper surface and having a first hollow unit in a longitudinal direction; a spacer having second air passage connected to the first air passage for air flow, and having a second hollow unit in a longitudinal direction; a rotation shaft being inserted into the second hollow unit of the spacer at interval and having third air passage connected to the second air passage for air flow, and having a third hollow unit in a longitudinal direction; and flanges for sealing up an interval between the spacer and the rotation shaft. The rotation shaft is installed in the moving block in a non-contact type by using the spacer to prevent the non-linear frictional force.

19 Claims, 7 Drawing Sheets

PARTS SUCTION HEAD HAVING NON-CONTACT SEALING STRUCTURE

BACKGROUND OF THE INVENTION

1. Field of the Invention

The present invention relates to a parts suction head having a non-contact sealing structure, and in particular to an improved parts suction head having a non-contact sealing structure which can precisely control rotation of a rotation shaft in a surface mount device.

2. Description of the Background Art

In general, a surface mount device is used to rapidly precisely mount a plurality of parts on a printed circuit board. The surface mount device for rapidly precisely mounting parts on the printed circuit board includes an X-Y gantry, a printed circuit board conveyor, a parts feeder and a head unit. The head unit is installed in the X-Y gantry, for mounting the parts on the printed circuit board transferred to a parts mounting operation position by the printed circuit board conveyor. The head unit receives the parts from the parts feeder to be mounted on the printed circuit board.

The head unit adsorbing the parts supplied from the parts feeder includes a plurality of parts suction heads. Each of the respective parts suction heads includes a motor, a ball spline and a socket unit. The parts suction head composed of a motor, a ball spline unit and a rotation shaft unit will now be described in detail with reference to the accompanying drawings.

Figure 1:
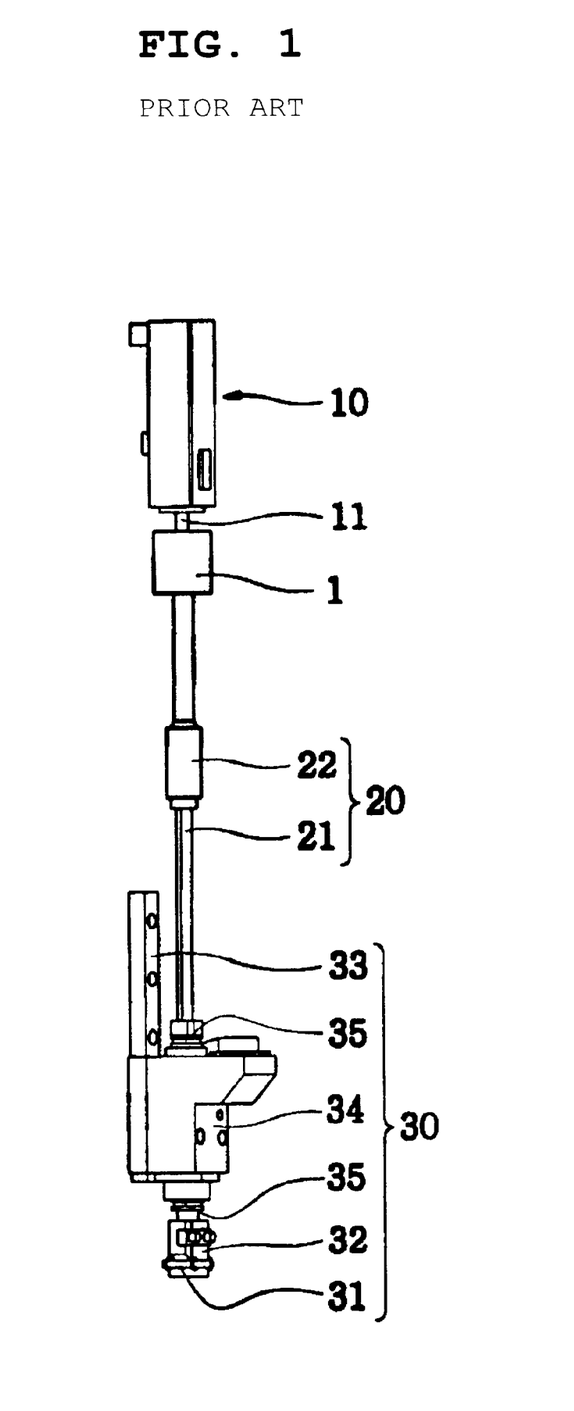
FIG. 1 is a side view illustrating a conventional parts suction head of a surface mount device.

FIG. 1 is a side view illustrating a conventional parts suction head of a surface mount device. Referring to FIG. 1, the parts suction head includes a motor 10, a ball spline unit 20 and a rotation shaft unit 30. A rotation central axis 11 of the motor 10 is connected to one end portion of the ball spline unit 20 by a coupling 1. The other end portion of the ball spline unit 20 is connected to the rotation shaft unit 30. The ball spline unit 20 connected to the rotation shaft unit 30 includes a ball spline 21 and a ball spline nut 22. The ball spline unit 20 performs a rotation movement due to a rotary force generated by the motor 10, and performs reciprocation in a vertical direction. When the parts suction head is moved in a vertical direction, the ball spline unit 20 prevents a load of the motor 10 from being transmitted to the rotation shaft unit 30.

The rotation shaft unit 30 connected to the other end portion of the ball spline unit 20 performing the rotation movement and the reciprocation includes a rotation shaft 31, a socket 32, an LM guide 33, a moving block 34 and flanges 35. The socket 32 is installed at one end portion of the rotation shaft 31, and the moving block 34 is disposed at the outer portion thereof. The flanges 35 are provided to both end portions of the moving block 34. Here, the rotation shaft 31 is assembled in the moving block 34. The LM guide 33 is positioned on the rear surface of the moving block 34 in order to vertically reciprocate the rotation shaft 31 assembled in the moving block 34.

The LM guide 33 guides the vertical reciprocation of the rotation shaft 31, the ball spline 21 and the moving block 34, so that the parts suction head of the rotation shaft 31 can suck the parts and mount it on the printed circuit board. When the parts to be mounted on the printed circuit board is not precisely sucked to the parts suction head, the rotation shaft 31 is rotated by the motor 10 in a predetermined radius, thereby correcting suction of the parts.

Figure 2:
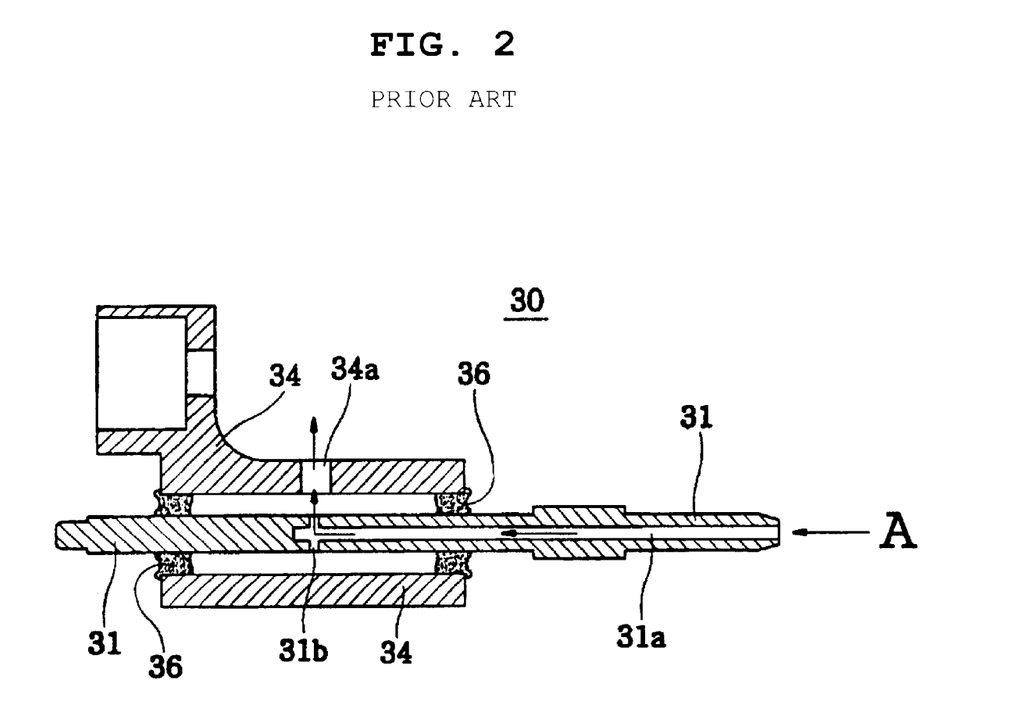
FIG. 2 is a cross-sectional view illustrating a rotation shaft unit having a contact sealing structure in FIG. 1.

The structure of the conventional rotation shaft unit 30 correcting the suction of the parts by rotating the rotation shaft 31 will now be explained with reference to FIG. 2. FIG. 2 is a cross-sectional view illustrating the conventional rotation shaft unit having the contact sealing structure in FIG. 1. As depicted in FIG. 2, when the rotation shaft 31 is inserted into the moving block 34, both end portions of the moving block 34 are sealed up by a sealing material 36 to prevent pressure reinforcement from being generated due to external air inputted from both end portions of the moving block 34. Here, air is flowed in and out in an arrow A direction through an air passage 34a of the moving block 34, and a hollow unit 31a and an air passage 31b of the rotation shaft 31 so as to generate a pressure for the parts suction.

The conventional rotation shaft has the contact structure. That is, the rotation shaft is inserted into the moving block, and both end portions of the moving block are sealed up by the sealing material. Accordingly, when the rotation shaft is rotated, a non-linear frictional force is generated between the sealing material containing rubber and the rotation shaft. In the case that the rotation shaft is precisely rotated, it is impossible to stabilize a rotation angle in a wanted time due to the non-linear frictional force.

SUMMARY OF THE INVENTION

Accordingly, it is a primary object of the present invention to provide a parts suction head having a non-contact sealing structure which can prevent a non-linear frictional force from being generated in rotation of a rotation shaft inserted into a moving block in a rotation shaft unit of a surface mount device.

It is another object of the present invention to stabilize rotation of a rotation shaft in a wanted time in precise rotation, by rotating a moving block and a rotation shaft in a non-contact type in a parts suction head.

In order to achieve the above-described object of the invention, there is provided a parts suction head having a non-contact sealing head comprising: a moving block having a plurality of first air passages on its upper surface and having a first hollow unit in a longitudinal direction; a spacer having at least one or more second air passage connected to the first air passage for air flow, and having a second hollow unit in a longitudinal direction; a rotation shaft being inserted into the second hollow unit of the spacer at a predetermined interval and having at least one or more third air passage connected to the second air passage for air flow, and having a third hollow unit in a longitudinal direction; and flanges mounted to both end portions of the moving block to seal up an interval between the spacer and the rotation shaft.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A parts suction head having a non-contact sealing structure in accordance with a preferred embodiment of the present invention will now be described in detail with reference to the accompanying drawings.

Figure 3:
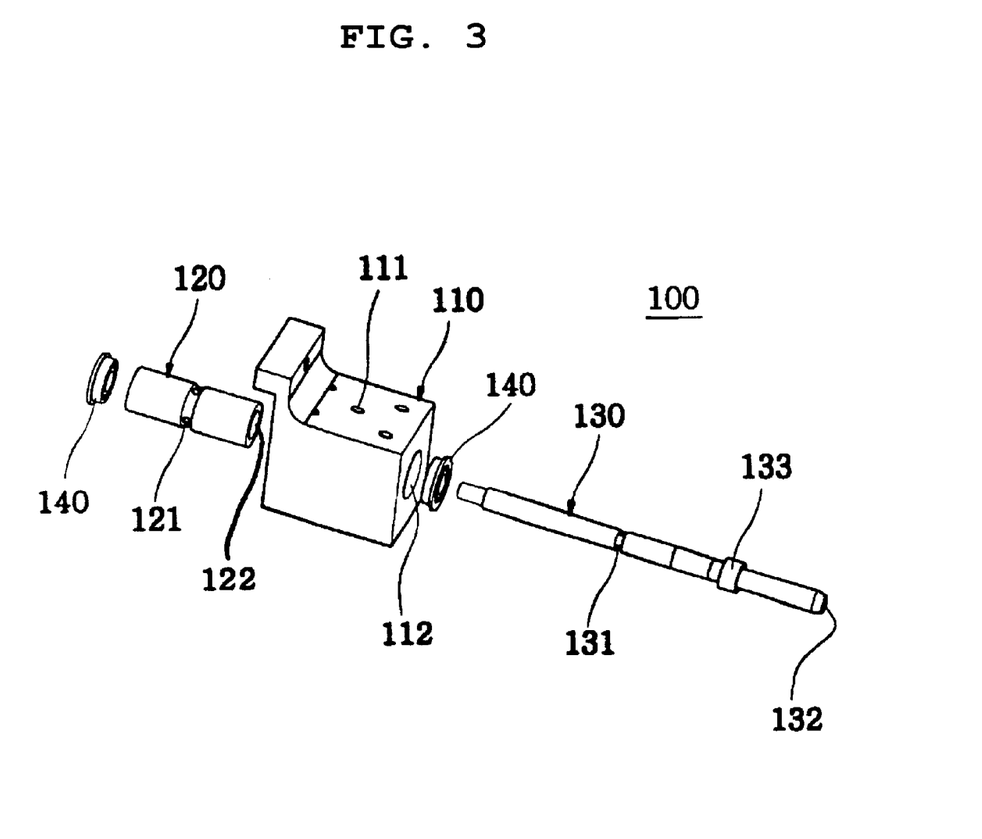
FIG. 3 is an exploded perspective view illustrating a rotation shaft unit having a non-contact sealing structure in accordance with the present invention.
Figure 4:
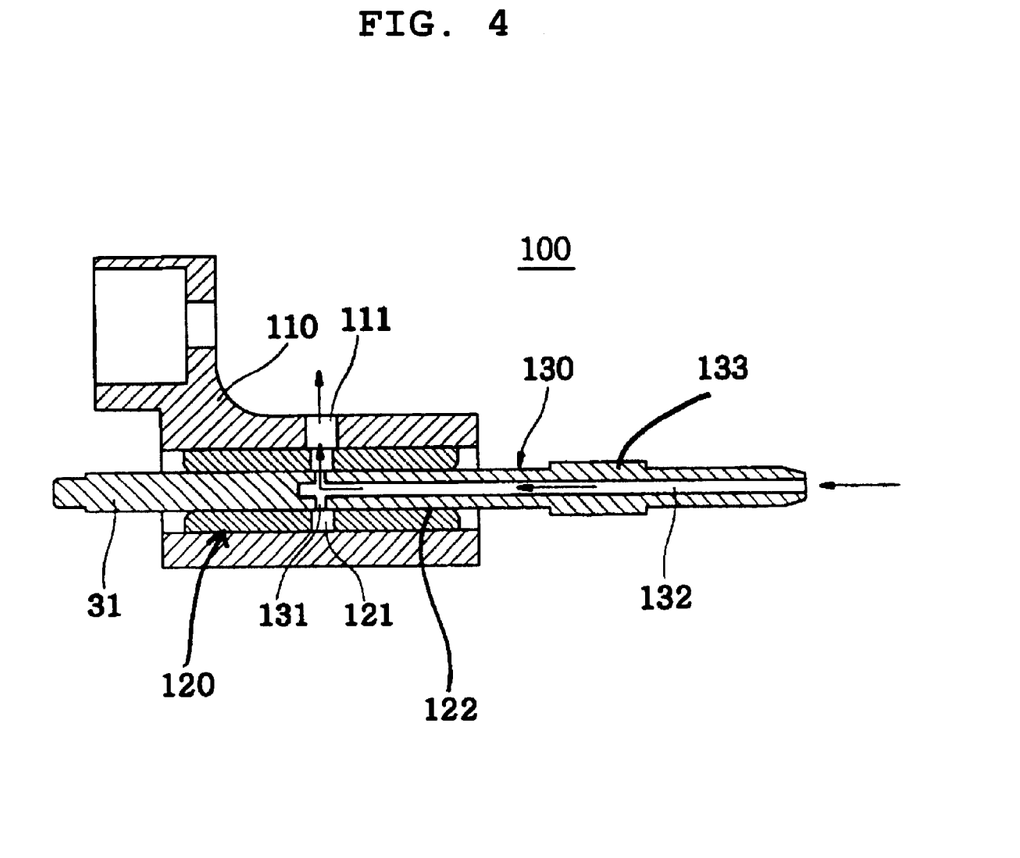
FIG. 4 is a cross-sectional view illustrating the rotation shaft unit of FIG. 3.
Figure 5:
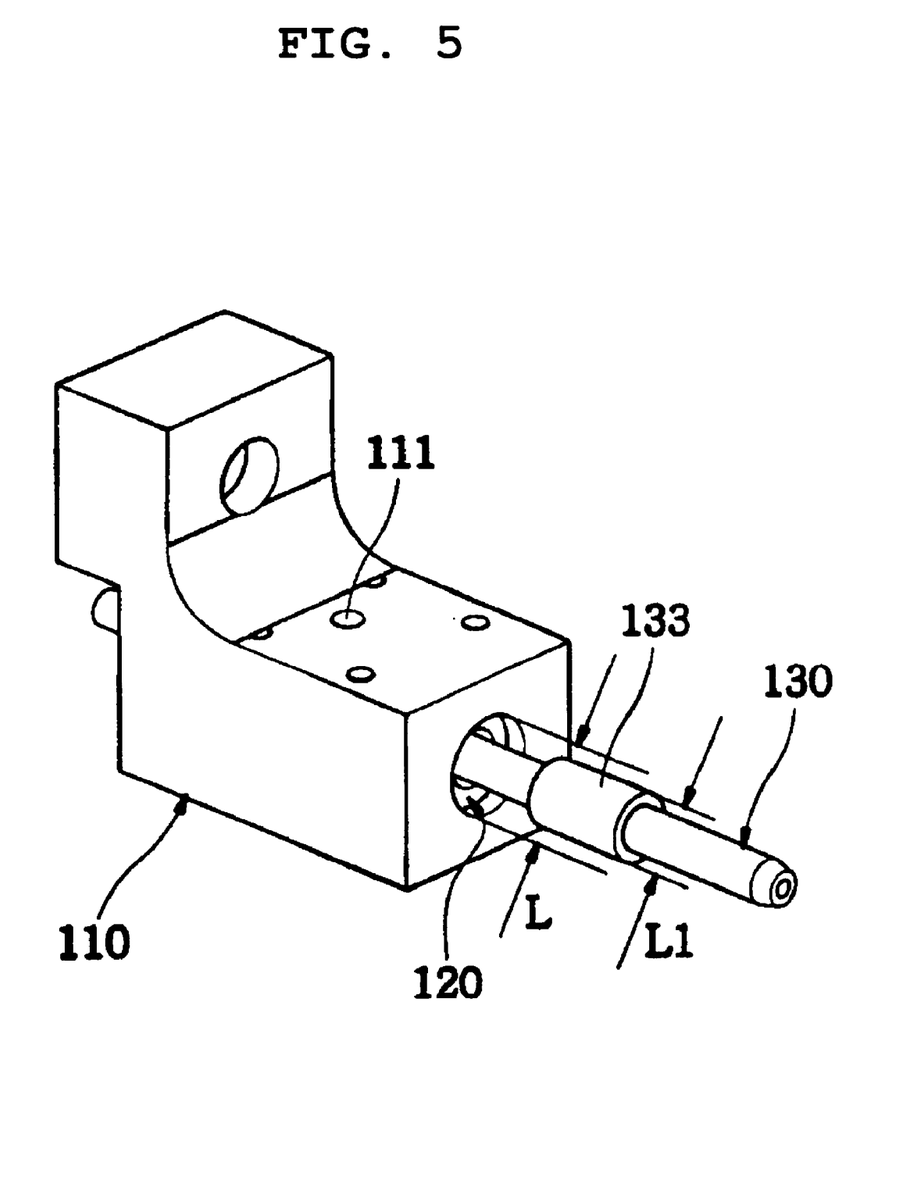
FIG. 5 is an enlarged perspective view illustrating a moving block of FIG. 3.

FIG. 3 is an exploded perspective view illustrating a rotation shaft unit having a non-contact sealing structure in accordance with the present invention, FIG. 4 is a cross-sectional view illustrating the rotation shaft unit of FIG. 3, and FIG. 5 is an enlarged perspective view illustrating a moving block of FIG. 3. As illustrated in FIGS. 3 to 5, the parts suction head includes: a moving block 110 having first air passages 111 and having a first hollow unit 112 in a longitudinal direction; a spacer 120 having at least one second air passage 121 connected to the first air passage 111 for air flow, and having a second hollow unit 122 in a longitudinal direction; and a rotation shaft 130 being inserted into the second hollow unit 122 of the spacer 120 at a predetermined interval, both end portions of the moving block 110 being sealed up by flange ball bearings 140, the rotation shaft 130 having the ball spline unit (20 in FIG. 1) and the motor (10 in FIG. 1) connected to its one end and having at least one or more third air passage 131 connected to the second air passage 121 for air flow, and having a third hollow unit 132 in a longitudinal direction.

The structure and operation of the present invention will now be explained in more detail.

The parts suction head having the non-contact structure includes the motor (10 in FIG. 1), the ball spline unit (20 in FIG. 1) and the rotation shaft unit 100. The motor 10 and the ball spline unit 20 are connected by the coupling 1, for providing a rotary force transmitted to the rotation central axis 11 of the motor 10 to the ball spline nut 22 and the ball spline 21 of the ball spline unit 20. The rotary force transmitted to the ball spline 21 is transmitted to the rotation shaft unit 100. The rotary force transmitted to the rotation shaft unit 100 rotates the rotation shaft 130, thereby correcting a suction state and position of the parts (not shown) sucked to the parts suction head.

In accordance with the present invention, when the rotation shaft 130 is rotated to correct the suction state and position of the parts, the rotation shaft 130 is rotated in a non-contact state from the moving block 110 to prevent generation of a non-linear frictional force. The rotation shaft unit 100 having the non-contact structure will now be explained in detail.

The non-contact structure of the rotation shaft unit 100 includes the moving block 110, the spacer 120, the rotation shaft 130 and the flange ball bearings 140. A plurality of first air passages 111 are formed on the top surface of the moving block 110, and the first hollow unit 112 is formed in a longitudinal direction of the moving block 110. As shown in FIG. 5, the spacer 120 is inserted into the first hollow unit 112 formed in the longitudinal direction of the moving block 110.

Figure 6:
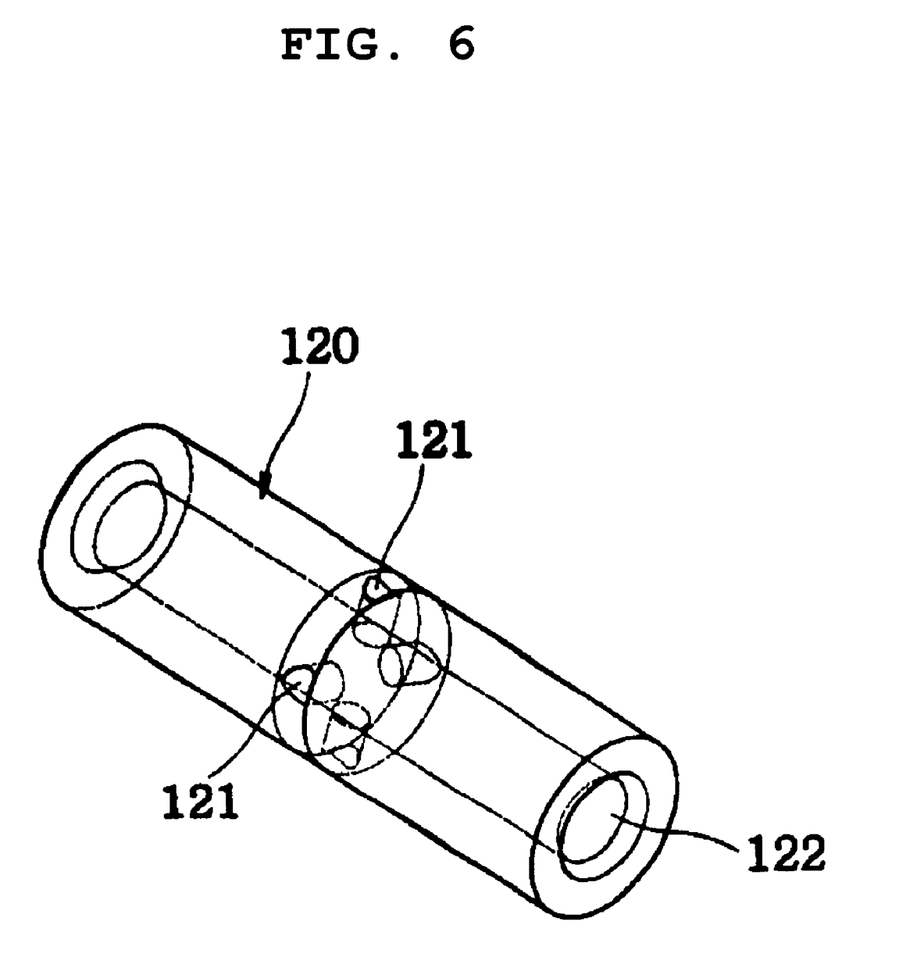
FIG. 6 is an enlarged perspective view illustrating a spacer of FIG. 3.

The spacer 120 is inserted into the first hollow unit 112 of the moving block 110, and has at least one or more second air passage 121 at its middle portion to be connected to the first air passages 111 for air flow. As depicted in FIG. 6, the second air passage 121 of the spacer 120 is divided at a predetermined angle, and thus formed in four directions. The second hollow unit 122 is formed in an internal longitudinal direction of the spacer 120 having the second air passage 121 divided in four directions.

The rotation shaft 130 is inserted into the second hollow unit 122 formed in the internal longitudinal direction of the spacer 120, maintaining a predetermined interval. Here, a value obtained by subtracting the whole diameter L1 of the rotation shaft 130 from a diameter L of the hollow unit 122 of the spacer 122 is below at least 10 $\mu$m. When the interval between the inner surface of the spacer 120 and the outer surface of the rotation shaft 130 is below 10 $\mu$m, the interval serves to prevent reduction of an air pressure.

When the rotation shaft 130 is inserted into the hollow unit 122 of the spacer 120 in a non-contact type, the flange ball bearings 140 are installed at both ends of the moving block 110, for sealing up the space between the spacer 120 and the rotation shaft 130. The flange ball bearings 140 used to seal up the space between the spacer 120 and the rotation shaft 130 serve to facilitate the rotation movement of the rotation shaft 130.

A bearing support member 133 for supporting the flange ball bearing is protruded from the other end portion of the rotation shaft 130 installed to the moving block by the flange ball bearings. The ball spline unit (20 in FIG. 1) and the motor (10 in FIG. 1) are connected to one end of the rotation shaft 130 from which the bearing support member 133 is protruded to support the flange ball bearings, so that the rotation shaft is rotated due to the rotary force generated by the motor 10.

Figure 7:
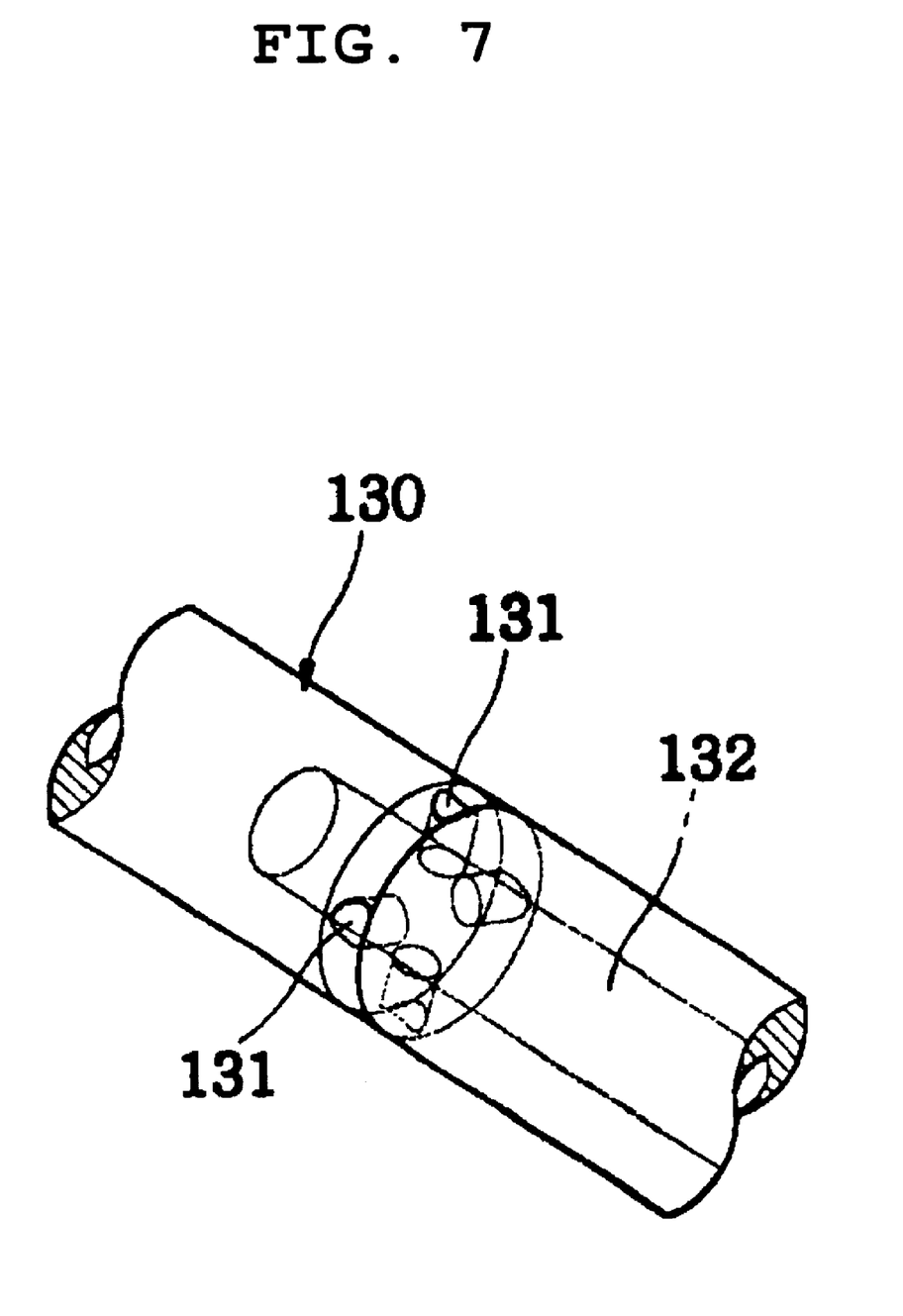
FIG. 7 is an enlarged perspective view illustrating major units of the rotation shaft of FIG. 3.

At least one or more third air passage 131 is formed at the rotation shaft 130 having its end connected to the motor 10 and the ball spline unit 20 to be connected to the second air passage 121 for air flow, and the third hollow unit 132 having a predetermined diameter I is formed in a longitudinal direction thereof. As depicted in FIG. 7, the third air passage 131 is divided at a predetermined angle, and thus formed in four directions.

The position of the third air passage 131 divided in four directions of the rotation shaft 130 is equivalent to the positions of the second air passage 121 of the spacer 120 and the first air passages 111 of the moving block 110, thereby forming an air passage in the arrow A direction shown in FIG. 2. When the air passage is formed, the air is inputted or discharged through an external air controller (not shown), and thus the air pressure is generated to or removed from the third hollow unit 132 formed in the longitudinal direction of the rotation shaft 130, the third air passage 131, the second air passage 121 and the first air passages 111, to suck and mount the parts.

In accordance with the present invention, the rotation shaft is installed in the moving block in a non-contact type by using the spacer, thereby preventing the non-linear frictional force from being generated due to friction. It is thus possible to precisely control the rotation angle of the rotation shaft in a wanted time.

As discussed earlier, the rotation shaft is installed in the moving block in a non-contact type by using the spacer in the rotation shaft unit applied to the parts suction head of the surface mount device, to prevent the non-linear frictional force from being generated due to friction. As a result, the rotation angle of the rotation shaft can be precisely controlled in a wanted time.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A parts suction head having a non-contact sealing head, comprising:
   a moving block comprising at least one first air passage on an upper surface and further comprising a first hollow unit with a length running parallel to a longitudinal axis of the moving block;
   a spacer fixed within the first hollow unit and comprising at least one second air passage connected to the at least one first air passage for air flow, and further comprising a second hollow unit with a length running parallel to a longitudinal axis of the spacer;
   a rotation shaft inserted into the second hollow unit of the spacer and comprising at least one third air passage connected to the at least one second air passage for air flow, and further comprising a third hollow unit with a length running parallel to a longitudinal axis of the rotation shaft; and
   at least one flange configured to seal an interval between the spacer and the rotation shaft.

2. The parts suction head of claim 1, wherein the at least one second air passage comprises four air passages.

3. The parts suction head of claim 1, wherein the rotation shaft and a surface of the second hollow unit are configured such that an interval is formed between the spacer and the rotation shaft, and the interval is at least less than 10 $\mu$m.

4. The parts suction head of claim 1, wherein the third air passage comprises four air passages.

5. The parts suction head of claim 1, wherein the at least one flange comprises a flange ball bearing.

6. The parts suction head of claim 5 further comprising a bearing support member configured to support the flange ball bearing.

7. The parts suction head of claim 6, wherein the bearing support member comprises an annular protrusion from a surface of the rotation shaft, wherein the protrusion is proximate to an end of the rotation shaft.

8. A parts suction head, comprising:
   a moving block comprising a first cylindrical aperture therethrough and an air port;
   a spacer disposed within the first cylindrical aperture and comprising a second cylindrical aperture therethrough; and
   a rotation shaft rotatably disposed within the second cylindrical aperture and comprising a tip, wherein the air port is in fluid communication with the tip through the moving block, spacer and rotation shaft.

9. The parts suction head of claim 8, wherein the air port is in fluid communication with the tip through a first radial air passage in the moving block, a second radial air passage in the spacer, and a third radial air passage and a longitudinal air passage in the rotation shaft.

10. The parts suction head of claim 9, wherein the second radial air passage and the third radial air passage each comprise multiple air passages.

11. The parts suction head of claim 10, wherein the multiple air passages of the second radial air passage extend perpendicular to a longitudinal axis of the spacer and are equally spaced about a longitudinal axis of the spacer, and the multiple air passages of the third radial air passage extend perpendicular to a longitudinal axis of the rotation shaft and are equally spaced about a longitudinal axis of the rotation shaft.

12. The parts suction head of claim 11, wherein the second radial air passage and the third radial air passage each comprise four air passages.

13. The parts suction head of claim 8, wherein the second cylindrical aperture defines an inner surface of the spacer, and the inner surface of the spacer and the rotation shaft are configured to form a gap therebetween.

14. The parts suction head of clam 13, wherein a difference between an inner diameter of the second cylindrical aperture and an outer diameter of the rotation shaft is less than about 10 $\mu$m.

15. The parts suction head of claim 8, further comprising at least one flange configured to mount at an end of the first cylindrical aperture.

16. The parts suction head of claim 15, wherein the at least one flange comprises a flange ball bearing configured to support the rotation shaft.

17. The parts suction head of claim 8, wherein the rotation shaft further comprises a bearing support member.

18. The parts suction head of claim 17, wherein the bearing support member comprises an annular shoulder on the rotation shaft.

19. The parts suction head of claim 8, further comprising first and second bearings mounted at opposite ends of the first cylindrical aperture and configured to rotatably support the rotation shaft such that the rotation shaft does not contact the spacer.

* * * * *